United States Patent
Bräuninger

Patent Number: 5,283,907
Date of Patent: Feb. 1, 1994

[54] PROCESS FOR SAFEGUARDING TRANSFER OF DATA FROM A TEMPORARY PART INTO A MAIN PART OF A NON-VOLATILE MEMORY

[75] Inventor: Jürgen Bräuninger, Stuttgart, Fed. Rep. of Germany

[73] Assignee: Robert Bosch GmbH, Stuttgart, Fed. Rep. of Germany

[21] Appl. No.: 478,733

[22] Filed: Feb. 9, 1990

Related U.S. Application Data

[63] Continuation of Ser. No. 155,714, Jan. 19, 1988, abandoned.

[30] Foreign Application Priority Data

May 20, 1986 [DE] Fed. Rep. of Germany ....... 3616895

[51] Int. Cl.$^5$ .............................................. G06F 12/16
[52] U.S. Cl. .............................. 395/800; 364/268; 364/969; 364/DIG. 1; 364/DIG. 2
[58] Field of Search ... 364/200 MS File, 900 MS File; 371/66, 8.1, 10.1; 365/228, 229; 395/DIG. 1 MS File, DIG. 2 MS File, 800, 400, 425, 575, 750

[56] References Cited

U.S. PATENT DOCUMENTS

| | | | |
|---|---|---|---|
| 4,096,578 | 6/1978 | Malkemes | 364/900 |
| 4,204,251 | 5/1980 | Brudevold | 364/200 |
| 4,234,920 | 11/1980 | Van Ness et al. | 364/200 |
| 4,279,020 | 7/1981 | Christian et al. | 364/900 |
| 4,506,346 | 3/1985 | Bennett et al. | 364/900 |
| 4,525,800 | 6/1985 | Hamerla | 364/900 |
| 4,601,008 | 7/1986 | Kato | 364/900 |
| 4,603,383 | 7/1986 | Tanaka et al. | 364/900 |
| 4,633,432 | 12/1986 | Kitamura | 364/900 |
| 4,663,730 | 5/1987 | Ikeda | 364/900 |
| 4,667,286 | 5/1987 | Young et al. | 364/200 |

FOREIGN PATENT DOCUMENTS

| | | |
|---|---|---|
| 0026980 | 4/1981 | European Pat. Off. . |
| 0039449 | 11/1981 | European Pat. Off. . |
| 2220150 | 2/1973 | Fed. Rep. of Germany . |

OTHER PUBLICATIONS

Desautels et al. "Battery Backup Failure Detection.", IBM Technical Disclosure Bulletin, vol. 26, No. 6 (Nov. 1983), pp. 2811-2812.

*Primary Examiner*—Robert B. Harrell
*Attorney, Agent, or Firm*—Michael J. Striker

[57] ABSTRACT

A process for storing data in a non-transient memory of a computer is proposed, whereby temporary memory cells are provided for the restoration of data lost due to switching off of the supply voltage. The temporary memory cells are sequentially loaded with the address, the data to be stored and various identification codes, so that the addressing and the data to be stored are safeguarded at all times. After switching off of the supply voltage an initialization routine is started, which tests the required memory cell content and, if necessary, loads them again.

4 Claims, 1 Drawing Sheet

PROCESS FOR SAFEGUARDING TRANSFER OF DATA FROM A TEMPORARY PART INTO A MAIN PART OF A NON-VOLATILE MEMORY

This application is a continuation of application Ser. No. 155,714, filed Jan. 19, 1988, now abandoned.

BACKGROUND OF THE INVENTION

The invention relates to a process for safeguarding the storage of data in a computer having a non-volatile memory.

When storing data in a memory cell of computerized controlling apparatuses with an attached memory, defective or incomplete data can he stored by switching off the supply voltage. Storing data in a memory cell of the memory can, for example, take 10 ms. If the voltage is switched off or impaired by interference during this time the memory cell can subsequently contain an undefined value. In other words, it is common that neither the new data is stored nor the old data is retained.

In order to safe guard the data to be stored multiple storage of these data is common practice and upon turning on the voltage again, the content of the memory cell is restored on the basis of conducting multiple decisions. For example, multiple storing can occur by means of three addresses, so that when voltage is turned on again, the content of the memory present in at least two of the memory cells is accepted. However, such multiple storage requires considerable expenditure of storage capacity and retention time.

SUMMARY OF THE INVENTION

It is an object of this invention to provide an improved process for the storage of data which in contrast to conventional methods has the advantage that with very little additional memory capacity the data are safe guarded during the storage process, and the restoration of the content of a memory cell which was lost due to switching off of the supply voltage is possible. There can be provisions for three temporary memory cells, of which the first and the third receive an identification code. In the second temporary memory cell the data to be stored is entered after the address was previously stored in the first temporary memory cell. Then, a temporary identification code is entered into the third temporary memory cell and in the forth storage step, storage of the data with the desired address takes place in a main memory. In two subsequent storage steps the original identification codes are stored in the first temporary memory cell and the second temporary memory cell. Such a storage cycle comprises six storage steps, whereby every storage step only causes one change in every memory cell. Now, if during the storage process this storage cycle is interrupted, then on the basis of the information or data contained within the individual memory cells the computer can recognize whether or not, the content was stored correctly at the desired address in the main memory, or whether or not correct storage was possible due to switching off of the supply voltage during the storage process.

After switching on the supply voltage, the correct address and the corresponding data can then be taken from the temporary memory cell provided for this purpose.

After turning on the supply voltage the content of the first and third memory cells are always checked, then the intended identification codes are stored therein and, if necessary, the content of the second temporary memory all is stored at the address entered into the first temporary memory cell. By means of a very simple memory cell query a test of the correct storage of data can be executed.

The process according to the invention can be utilized in a particularly advantageous manner in electronic controlling devices of motor vehicles. There it can serve advantageously for safe guarding data of an electronic tachograph or also for the safe guarding of storage processes of motor-specific data, which indicates the condition of the motor. Especially the internal electrical system of motor vehicles are exposed to varying influences while in operation, which can cause voltage fluctuations. If these voltage fluctuations reach values which can interfere with a transfer of data, the process according to the invention allows for a clear determination of where a storage process could not be concluded correctly following such an interference, so that this storage process can, if necessary, be repeated again. Furthermore, it is of special significance that the process according to the invention can also recognize an incorrect transfer of data due to switching off of the ignition and the simultaneously occurring switching off of the supply voltage and that thereby a wrong storage of data is prevented.

DETAILED DESCRIPTION OF THE PREFERRED EMBODIMENTS

Figure 1:
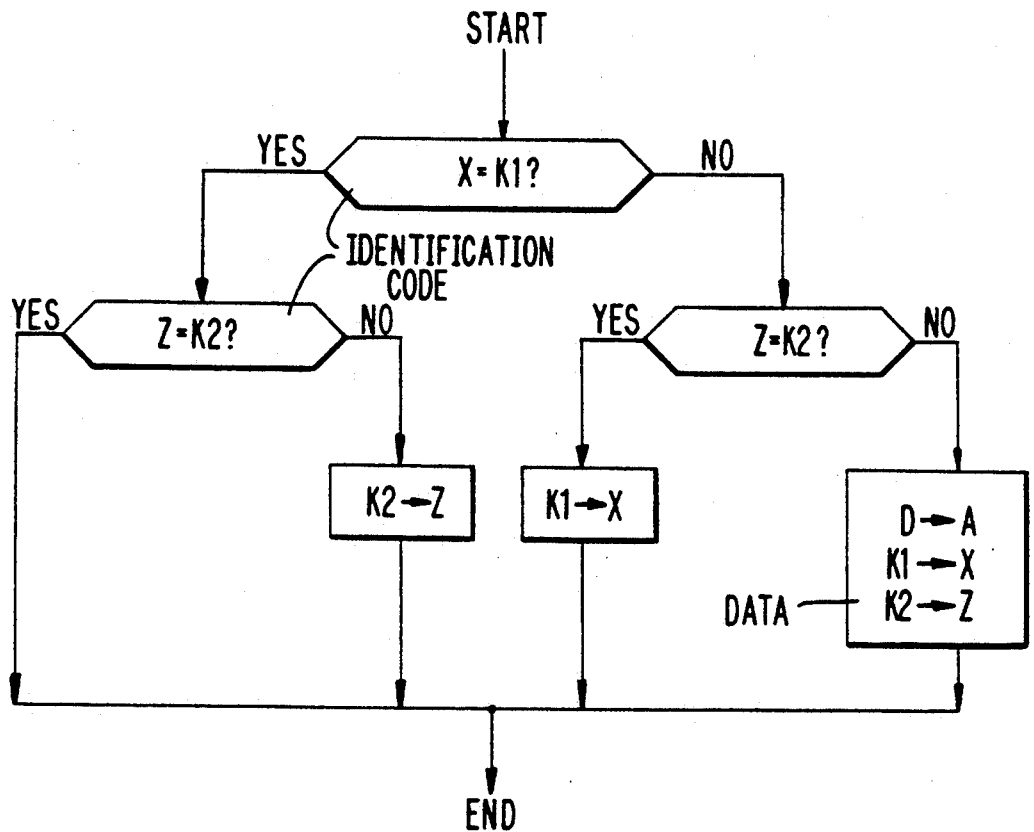
FIG. 1 illustrates a flow chart of an initializing routine in the storage process of the invention.
Figure 2:
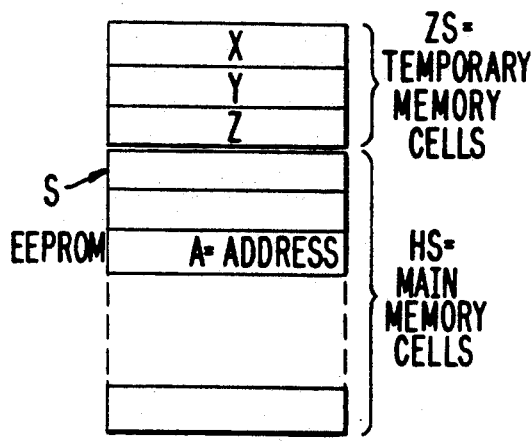
FIG. 2 illustrates a few memory cells of a non-volatile memory (EEPROM) divided into a temporary memory and a main memory and FIG. 3 illustrates the fundamental design of a computerized controlling device with a non-volatile memory.

The safeguarding storage process is explained by means of the following table, the flow diagram illustrated in FIG. 1 and the memory cells illustrated in FIG. 2. In order to safe guard and restore the content of a memory cell lost because the supply voltage was switched off, three memory cells X, Y, Z are used as a temporary memory ZS. The address A listed in the table indicates a memory cell where data D is to be stored in a main memory HS.

TABLE

|  | Process Steps | | | |
| --- | --- | --- | --- | --- |
|  | X | Y | Z | A |
| Beginning | K1 | ? | K2 | ? |
| 1. | A | ? | K2 | ? |
| 2. | A | D | K2 | ? |
| 3. | A | D | K0 | ? |
| 4. | A | D | K0 | D |
| 5. | K1 | D | K0 | D |
| 6. | K1 | D | K2 | D |

For example, a non-volatile memory S such as an electrically erasable programmable read-only memory EEPROM can be used as a main memory HS and a temporary memory ZS, in which the three temporary memory cells have the addresses X, Y and Z. Initially the identification code K1 is stored into the memory cell X, and the identification code K2 into the memory cell Z. If data D is to be stored under the address A in the main memory HS, then the storage process occurs as follows:

1. The address A is stored in the memory cell X.
2. The data D is stored in the memory cell Y.
3. A temporary identification code KO is stored in memory cell Z.
4. The data D is stored in the main memory cell A, which constitutes the actual storage.
5. The identification code K1 is stored in memory cell X.
6. The identification code K2 is stored in memory cell Z.

The identification code K1 must be different from all possible addresses in the memory S and the temporary identification code KO must differ from K2. The identification codes K1 and K2 can, however, be the same. It should be noted that each of the steps 1 through 6 can be interrupted by switching off the voltage which could possibly lead to the corruption of the content of the memory cell X, Y, Z, A just being described.

Every time the voltage is again turned on the memory cells X and Z are tested in an initializing routine shown in FIG. 1.

If the memory cell X contains the identification code K1, then no interruption can have taken place between the completion of step 1 through the completion of step 5, that is, except for the memory cells X, Y, and Z, the content of all other memory cells is not corrupted. In order to restore the correct initial condition of X and Z the identification code K2 is stored into memory cell Z, in the event that memory cell Z does not already contain the identification code K2.

If the memory cell X does not contain the identification code K1, but the memory cell Z does contain the identification code K2, then no interruption can have taken place between completion of step 3 through the completion of step 6 of the last storage procedure, that is, except for the memory cells X, Y and Z, the content of all memory cells is not corrupted. In order to establish the correct initial condition of X and Z the identification code K1 is stored into memory cell X.

If by contrast the memory cell X does not contain the identification code K1 and the memory cell Z does not contain the identification code K2, then the voltage was switched off between the completion of step 3 and the completion of step 5 of a storage process as described above. Memory cell X then contains the address A and memory cell Y the data to be stored there. In this case step 4 can possibly have been interrupted. Then, the content of memory cell A is questionable. For this reason the storage process discussed is concluded with steps 4, 5 and 6. The values necessary for the address A and the data D are available in the memory cells X and Y.

The above mentioned initializing routine started after a momentary switching off operates in such a manner, that first it is tested to see whether or not the content of memory cell X is equal K1. If this is the case, it is then tested to see whether or not the content of Z is equal to K2. If Z=K2, then the initializing routine is concluded; if in contrast Z is not equal to K2, then K2 is stored to Z.

If after the start of the initializing routine it is determined that the memory cell X is not equal to K1, then it is tested to see if Z is equal to K2 and if this is affirmative, then K1 is stored to X. If Z is not equal to K2, D is stored from Y to A, then K1 to X followed by K2 to Z. The initializing routine is then complete.

Figure 3:
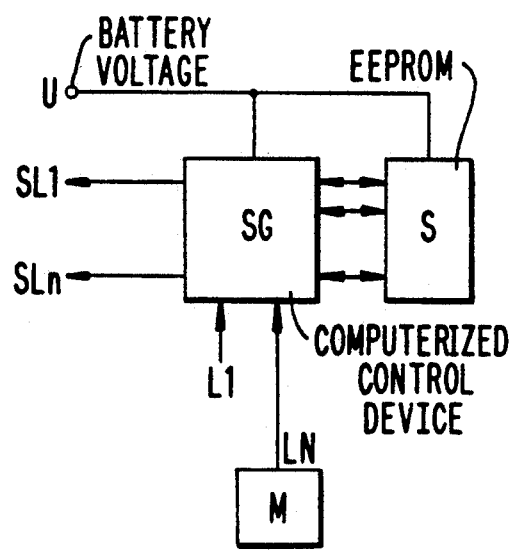

The basic design of a computerized controlling device SG with allocated non-volatile memory S is illustrated in FIG. 3. The controlling device SG as well as the memory S are supplied by the battery voltage U. The controlling device SG is connected by means of several data lines L1 to Ln to sensors or other transmitting devices, which can be placed on the motor M or other devices to be monitored. The controlling device SG processes the received data and stores them in the memory S in accordance with the process of this invention. On the basis of stored data and current data the controlling device SG executes its controlling function, whereby the necessary control signals are transmitted to the corresponding devices via control lines SL1 through SLn.

I claim:

1. Process for safeguarding storage of data into a non-volatile memory of a computerized control device, comprising the steps of storing, in the following order, two identification codes (K1, K2), and address (a), data (D) and a temporary identification code (KO) into a temporary part of the memory; storing the data (D) into a main part of the memory at the address (A); and if an interference occurs during the storing steps, the control device initiates a routine which tests the two identification codes in the temporary memory part and if a corruption of the two codes has been determined, the routine reloads the temporary memory part and restores the data (D) in the main memory part.

2. Process according to claim 1 wherein said non-volatile memory is an EEPROM.

3. Process according to claim 1, wherein in a preliminary step a first identification code (K1) is stored in a temporary first memory cell (X) and a second identification code (K2) is stored in a temporary second memory cell (Z); in a first storing step the address (A) is stored in the first temporary memory cell (X); in a second step the data (D) is stored in a temporary third memory cell (Y); in a third step the temporary identification code (K0) is stored in the second temporary memory cell (Z); in a fourth step the data (D) is stored at the address (A) in the main memory part (HS); in a fifth step the first identification code (K1) is restored in the first temporary memory cell (X); and in a sixth step the second identification code (K2) is restored in the second temporary memory cell (Z).

4. Process according to claim 3, wherein said routine first tests whether the first memory cell (X) contains the first identification code (K1) and the second memory cell (Z) the second identification code (K2); if this condition is met, a continuous storage of the data (D) is completed and the storing steps are resumed; if this condition is not met, the routine loads the first identification code (K1) into the first memory cell (X), then loads the second identification code (K2) into the second memory cell (Z) and then restores the data (D) at the address (A) in the main memory part (HS).

* * * * *